US005920460A

United States Patent [19]
Oldendorf et al.

[11] Patent Number: 5,920,460
[45] Date of Patent: Jul. 6, 1999

[54] PC CARD RECEPTACLE WITH INTEGRAL GROUND CLIPS

[75] Inventors: John G. Oldendorf, Prospect Heights; Marlon C. Daniels, Jr., Chicago; Mark W. Stack, Hoffman Estates, all of Ill.

[73] Assignee: Methode Electronics, Inc., Chicago, Ill.

[21] Appl. No.: 08/785,761

[22] Filed: Jan. 11, 1997

[51] Int. Cl.⁶ .................................................. H05K 5/00
[52] U.S. Cl. ..................... 361/753; 361/737; 361/740; 361/759; 361/747; 361/799; 361/801; 439/946
[58] Field of Search ..................... 361/732, 740, 361/747, 752, 753, 759, 737, 800, 801, 802, 816, 818, 799; 439/946, 76.1, 95, 60, 607; 174/35 R; 235/380, 441, 492, 435, 487; 257/679; 902/26

[56] References Cited

U.S. PATENT DOCUMENTS

| | | | |
|---|---|---|---|
| 4,872,091 | 10/1989 | Maniwa | 361/424 |
| 4,924,076 | 5/1990 | Kitamura | 235/492 |
| 4,955,817 | 9/1990 | Sugai | 439/60 |
| 5,169,323 | 12/1992 | Kawai et al. | 439/95 |
| 5,196,994 | 3/1993 | Tanuma et al. | 439/60 |
| 5,288,247 | 2/1994 | Kaufman et al. | 439/607 |
| 5,308,251 | 5/1994 | Kaufman et al. | 439/64 |
| 5,399,105 | 3/1995 | Kaufman et al. | 439/609 |
| 5,478,260 | 12/1995 | Kaufman et al. | 439/609 |
| 5,490,043 | 2/1996 | Tan et al. | 361/818 |
| 5,505,628 | 4/1996 | Ramey et al. | 439/76.1 |
| 5,537,294 | 7/1996 | Siwinski | 361/753 |
| 5,603,620 | 2/1997 | Hinze et al. | 439/95 |
| 5,749,741 | 5/1998 | Bellas et al. | 439/95 |

FOREIGN PATENT DOCUMENTS

| | | | |
|---|---|---|---|
| 0 233 649 | 8/1987 | European Pat. Off. | G06K 19/06 |
| 0 578 888 A1 | 1/1994 | European Pat. Off. | G06K 19/077 |
| 1-198394 | 8/1989 | Japan | B42D 15/02 |
| 1-299091 | 12/1989 | Japan | B42D 15/10 |
| 2-120095 | 5/1990 | Japan | B42D 15/10 |
| 2-246199 | 10/1990 | Japan | H05K 9/00 |
| 647442 | 7/1948 | United Kingdom . | |

*Primary Examiner*—Leo P. Picard
*Assistant Examiner*—Phuong T. Vu
*Attorney, Agent, or Firm*—David L. Newman

[57] ABSTRACT

An electronic circuit module having a metal cover is provided for interconnecting with a host device. The module includes an interface whereby electronic signals can be exchanged between the module and the host device. A mechanism for electrically grounding the metal cover to the ground plane of a printed circuit board housed within the module is provided along with a device for connecting the ground plane of the printed circuit board to a signal reference ground potential supplied by the host device. The present invention includes a module frame for attaching the metal cover thereto. A printed circuit board, including a ground plane, is mounted within the frame. A connector having a plurality of contact elements electrically connected to various the circuits disposed on the printed circuit board, including at least one contact element electrically connected to the ground plane is also adapted to fit within the module frame. The connector includes at least one grounding member. The grounding member forms an electrical connection with one of the contact elements of the connector which is electrically connected to the ground plane of the printed circuit board. With the module fully assembled, the grounding member engages the metal cover, thereby forming a ground path between said cover and the ground plane. The contact element connected to the ground plane of the printed circuit board is positioned within the connector to receive the ground pin of a mating connector located on the host device.

21 Claims, 5 Drawing Sheets

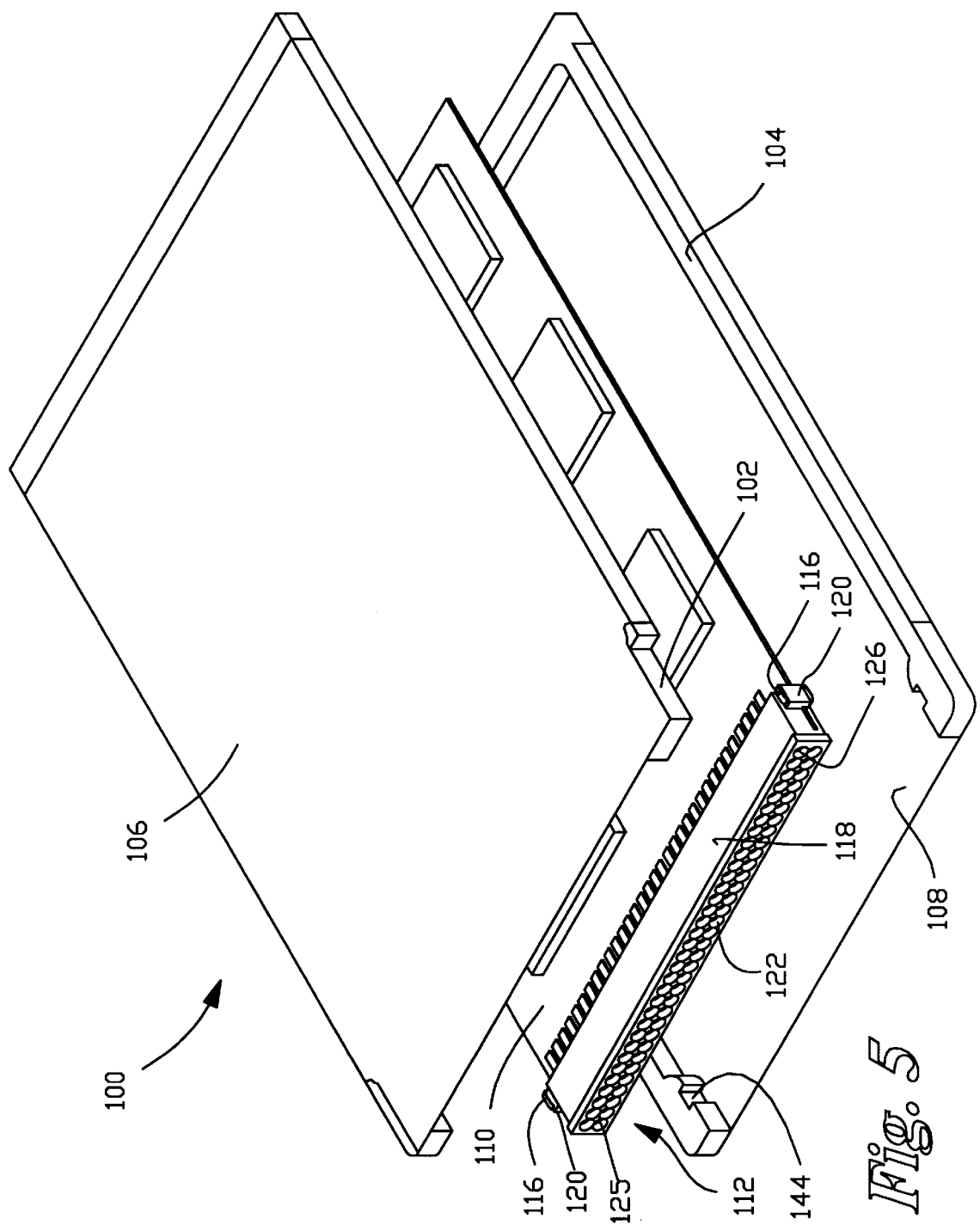

PC CARD RECEPTACLE WITH INTEGRAL GROUND CLIPS

BACKGROUND OF THE INVENTION

The present invention relates to an electronic circuit module having an improved mechanism for electrically connecting top and bottom metal covers to the ground plane of a printed circuit board housed within the module, and includes provisions for connecting the ground plane of the printed circuit board to a reference ground potential of a host device. The preferred embodiment of the invention provides these improved features in an electronic circuit module conforming to the PCMCIA standard for electronic devices, however, it should be clear to one of ordinary skill in the art that the present invention is well adapted for use with other electronic modules not conforming to the PCMCIA standard but nevertheless having metal covers requiring grounding, and modules further requiring the connection of an internal printed circuit board ground plane to a reference ground potential of a host device.

Printed circuit board modules are well known in the art. Generally, such devices are provided to increase the capacity or add additional functionality to a host device. Common applications include supplying additional memory, modems, or pluggable software modules for personal computers. The PCMCIA standard was developed in order to maintain interconnectability between various manufacturer's devices. The standard provides uniform external package specifications and connector requirements so that various electronic circuit modules can be interchangeable with various model small computers. When assembled, a PCMCIA card comprises a narrow rectangular card like package having a 68 pin connector integrally provided with one of the short transverse edges of the PCMCIA package. This standard configuration allows the PCMCIA card to slide into a narrow predefined slot within a personal computer, or other host device, where the 68 pin connector engages a similarly configured mating connector located at the end of the slot. The connection between the host device and the PCMCIA card allows the additional electronic circuitry housed within the PCMCIA card to interact with the host device.

PCMCIA packages and the printed circuit boards housed within them are usually manufactured separately. Generally, the printed circuit board is manufactured first, having the 68 pin connector soldered to an edge of the board. Then the PCMCIA package is assembled around the printed circuit board, or alternatively, the printed circuit board is inserted into a pre-assembled PCMCIA package through an opening in the connector side of the package. In either case, the completed assembly forms a sealed module with the 68 pin connector being integrally formed within one edge of the module.

In most cases, PCMCIA cards consist of a plastic rectangular frame which acts to support the printed circuit board and the 68 pin connector. Top and bottom covers, usually made of metal, attach to both sides of the frame forming an internal cavity for housing the printed circuit board. A variety of methods for attaching the metal covers to the plastic frames are known in the art. Some PCMCIA cards are made having a single frame and metal covers that snap fit over the frame. Others are made having two piece frames where each half of the frame is injection molded directly to the top and bottom covers, and the two frame portions are welded together around the printed circuit board. Depending in the design, the printed circuit board can be placed in the frame before the module is assembled, or it can be inserted into the internal cavity between the two covers after the frame and covers have been assembled. In either case, a standard PCMCIA package results having metal top and bottom covers secured over a plastic frame. The plastic frame supports the printed circuit board and secures the 68 pin connector within a transverse edge of the package.

The electronic device housed within the PCMCIA package will be exchanging signals with the host device, therefore, it is necessary that the signals generated by the PCMCIA device share the same reference ground potential as the signals generated by the host device. To ensure this, the ground plane of the printed circuit board must be connected to the reference ground potential supplied by the host device. The reference ground of the host device can be brought to the printed circuit board via ground pins included within the 68 pin connector, the ground pins can then be soldered to contact pads connected to the ground plane of the printed circuit board. It is also desirable to protect the PCMCIA device against the deleterious effects of electromagnetic interference (EMI). This can be accomplished by grounding the metal covers of the PCMCIA package to provide a degree of EMI shielding.

A number of methods have been employed for grounding the metal covers of PCMCIA cards, most involving the use of ground clips which clip onto the printed circuit board then extend perpendicularly away from the board to contact the covers. The use of ground clips requires the formation of ground pads on the surfaces of the printed circuit board, and the ground pads are then connected to the ground plane of the printed circuit board. In one design, ground clips are attached to ground pads prior to the assembly of the PCMCIA package. Using this approach, the ground clips can be soldered to the ground pads to ensure a secure path to ground. In another prior art design, ground clips are inserted over the frame after the printed circuit board has been placed within the frame. The metal covers snap over the frame, thereby contacting the ground clips. This latter design has the advantage of being easier to assemble, but provides a less solid path to ground. Furthermore, the external ground clip design cannot be used with those PCMCIA packages having the frame portions injection molded directly to the metal covers. In a final prior are design, tabs are formed integrally with the metal covers. When the covers are placed over the frame, the tabs engage the ground pads on the printed circuit board.

A major problem with existing methods of grounding the covers of PCMCIA cards is the necessity of forming ground pads on the surface of the printed circuit board. To meet the requirements of the PCMCIA standard, an electronic device must fit on the surface of a compact printed circuit board capable of being mounted within a PCMCIA size frame. Because of the size limitations of the PCMCIA standard, space on the printed circuit board is at a premium. Providing ground pads on the surface of the board takes up valuable real estate on the printed circuit board which could be used more productively by adding additional circuitry and functionality to the device.

An additional problem with existing designs is that they require an additional step in the manufacturing process. Prior to the final assembly of the PCMCIA package, the ground clips must be inserted onto the printed circuit board to engage the ground pads. In some cases, the clips must then be soldered to the pads. The insertion of ground clips onto the printed circuit board adds time and cost to the assembly process, raising the cost of the final product.

In light of the problems with the prior art, a need exists for an electronic circuit module having an improved mechanism for grounding the metal covers of the module to the ground plane of a printed circuit board inserted therein. The improved mechanism should accomplish this task without requiring the formation of ground pads on the printed circuit board, or any other structures which consume real estate on the printed circuit board. Furthermore, such an improved mechanism should perform its grounding function without requiring any additional assembly steps. In other words, the grounding of the metal covers of the PCMCIA package should be accomplished by the act of assembling the package itself, with no additional steps required. Finally, in addition to grounding the metal covers, the improved grounding mechanism should also electrically connect the metal covers and the ground plane of the printed circuit board to a designated ground pin of the module connector so that the ground reference of the host device can be coupled to the ground plane of the printed circuit board.

SUMMARY OF THE INVENTION

In light of the prior art as described above, one of the main objectives of the present invention is to provide an electronic circuit module having an improved mechanism for grounding top and bottom metal covers to the ground plane of a printed circuit board mounted therein.

Another object of the present invention is to provide an electronic circuit module having an improved mechanism for coupling the ground plane of the module's printed circuit board to the reference ground potential of a host device.

A further object of the present invention is to provide an electronic module wherein the mechanism for grounding the metal covers is electrically connected to the mechanism for connecting the ground plane of the printed circuit board to the reference ground potential of the host device.

Still another objective of the present invention is to provide an electronic circuit module wherein the improved mechanism for connecting the metal covers to the ground plane of the printed circuit board is integrally formed as part of an electrical connector for coupling the module to a host device.

Yet another objective of the present invention is to provide an electronic circuit module wherein the improved mechanism for grounding the metal covers of the module does not require any space on the module's printed circuit board.

An additional objective of the present invention is to provide an improved mechanism for connecting the metal covers to the ground plane of the printed circuit board wherein the connection is made when the module is assembled, with no additional assembly steps required.

All of these objectives, as well as others that will become apparent upon reading the detailed description of the presently preferred embodiment of the invention, are met by the electronic circuit module having an improved mechanism for grounding the metal covers thereof as disclosed herein.

In the presently preferred embodiment, an electronic module is provide for use in conjunction with a host device. The module being configured to provide additional circuitry for expanding the functionality of the host device, such as for instance, supplying additional memory, a modem, or some other peripheral device, for a personal computer. The module includes a printed circuit board on which the additional circuitry for the device is mounted, a connector for coupling electronic signals between the module and a host device, a support frame, and metal covers for enclosing the device and providing electromagnetic shielding.

The connector body is formed of plastic, or some other insulating material, and houses a plurality of contact elements. The connector is configured to mate with a similar connector of opposite gender mounted within the host device. In the preferred embodiment, the mating connectors are 68 position connectors, with the host connector containing 68 male contact pins which are insertable into 68 female contact elements housed in the module connector. This embodiment is preferred so as to conform to the PCMCIA standard, however, it should be noted that the present invention may be practiced with connector arrangements having other than 68 positions, and alternate gender arrangements without deviating from the novel aspects of the invention. In the connector of the preferred embodiment, the first, thirty-fourth, thirty-fifth, and sixty-eighth contact positions are designated as ground positions. All of the various contact elements of the module connector are soldered to contact pads on the edge of the printed circuit board, including the contact elements in connector positions 1, 34, 35 and 68 which are soldered to contact pads connected to the ground plane of the printed circuit board. Host connector pins 1,34, 35, and 68 are connected to the host's reference ground potential, thus, when the circuit module is coupled to the host, and the two connectors mated, the ground plane of the printed circuit board is tied to the reference ground potential of the host device.

Mounting shoulders are formed at both ends of plastic housing of the module connector. The mounting shoulders act to align the connector and hold it securely in place when the printed circuit board is placed within the frame. U-shaped conductive grounding members are configured to mount over the mounting shoulders. The mounting shoulders are formed with internal slots which extend through the shoulders and extend into the main body of the connector housing such that the slots communicate with the contact cavities of ground position contacts. Each grounding member is formed with an offset vertical tail configured to be inserted into the slots formed in mounting shoulders of the connector housing such that they extend into the contact cavities of the ground position contacts. The ground member tail can be configured to engage the female contact element within the ground position cavity, or it can be configured to extend into the contact cavity where it can be engaged by the male ground pin of the host connector when the male connector pin is inserted therein. In either case, when an assembled module is coupled to the host device, the ground pins of the host connector are electrically coupled to tails of the grounding members. In this way the ground plane of the printed circuit board, and the grounding members are both tied to the common reference ground potential of the host.

An advantage of the present invention is that module connectors can be mass produced with the grounding members already inserted into the connector housing as pre-assembled components. For final assembly of electronic circuit modules a manufacturer need only solder the connectors to printed circuit boards and the grounding members will be automatically positioned. There is no requirement that additional grounding clips be placed elsewhere on the printed circuit board, thus eliminating an extra step in the assembly process.

Once the connector has been attached to the printed circuit board, the assembly can be placed in the frame. The parallel arms of the U-shaped grounding members extend horizontally at a width greater than the width of the frame. Thus, with the metal covers attached to the frame, the covers compress the arms of the grounding members as they are attached to the frame. Elastic spring forces within the grounding members bias the arms of the grounding members against the covers, thereby providing a solid electrical connection between the covers and the grounding members. Since the grounding members are already connected to the ground plane of the printed circuit board, the act of assembling the module provides the electrical connection between the covers and the ground plane. As noted above, when the assembled module is coupled to the host device, the grounding members are connected to the reference ground potential of the host device. Thus, with metal covers contacting the arms of the grounding members, the covers will also be tied to the reference ground of the host device, providing a degree of shielding against the ill effects of electromagnetic interference.

BRIEF DESCRIPTION OF THE DRAWINGS

FIG. 5 is an exploded isometric view of an electronic module according to the present invention prior to final assembly showing the connector assembly of FIG. 3 attached to a printed circuit board and the printed circuit board being inserted between a two piece module frame wherein the two frame pieces are injection molded directly to top and bottom metal covers.

DETAILED DESCRIPTION OF THE PRESENTLY PREFERRED EMBODIMENTS

Figure 1:
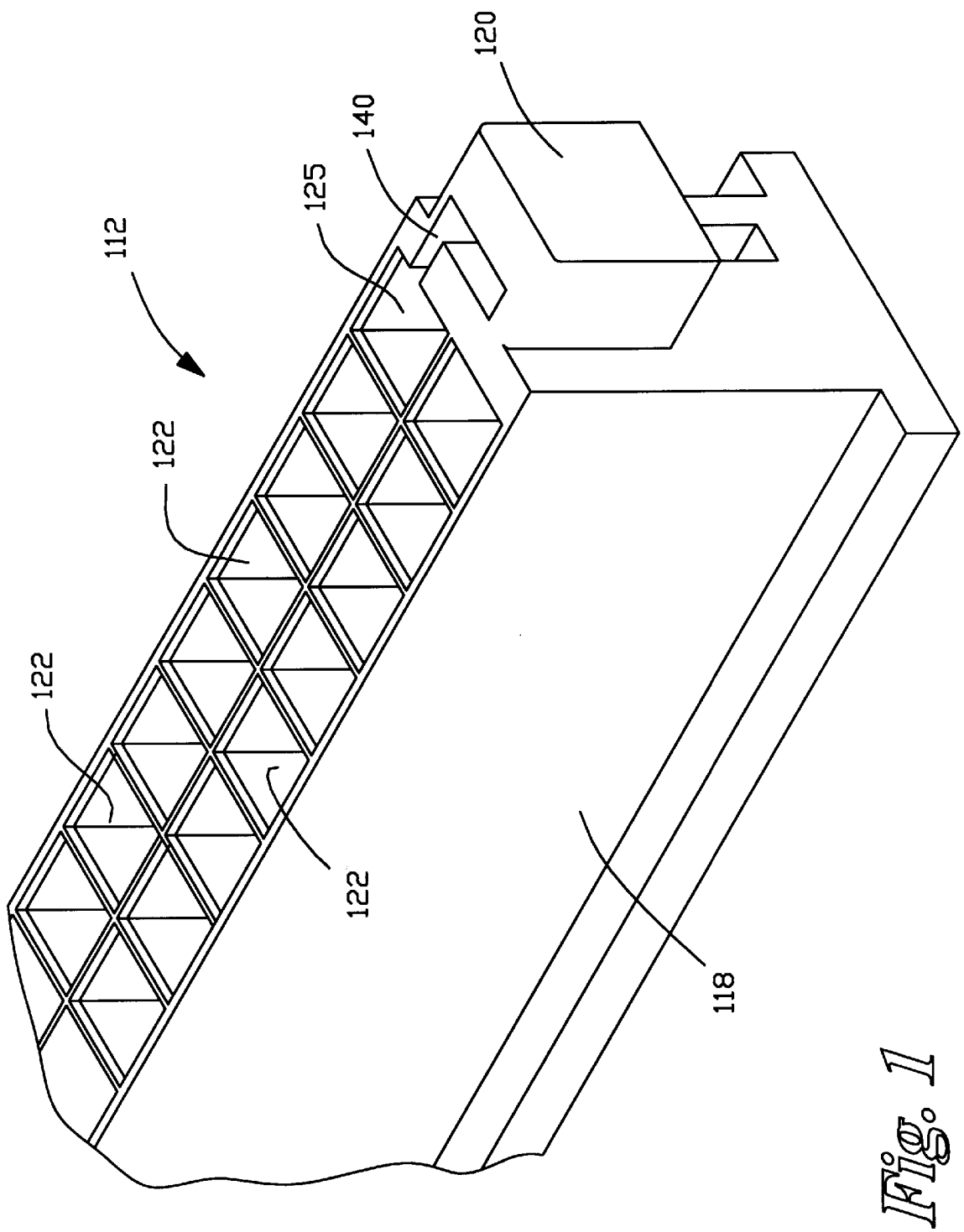
FIG. 1 is an isometric view showing a first side of a connector according to the present invention, the side shown being that side which connects to a printed circuit board.

The present invention relates to an electronic circuit module having an improved mechanism for electrically connecting the metal covers of the module to the ground plane of a printed circuit board housed within the module, and for connecting the ground plane of the printed circuit board the reference ground potential of a host device. The preferred embodiment of the invention is an electronic circuit module conforming to the PCMCIA standard for electronic devices. However, the invention should not be considered as limited to PMCIA style modules only. The present invention can be practically applied any circuit module having metal covers in which it is desirable to electrically connect the covers to a printed circuit board housed therein.

Referring to FIG. 5, an unassembled PCMCIA package 100 is shown. The package 100 depicted in FIG. 5 is of a type having a two piece frame comprising top and bottom support members 102, 104 injection molded directly to top and bottom metal covers 106, 108. Electronic circuitry which comprises a PCMCIA device is mounted on a printed circuit board 110 configured to mount within support members 102, 104. A sixty-eight pin female connector 112 is soldered to printed circuit board 110 for coupling the various electronic signals between the PCMCIA device and a host device. The package 100, is assembled by placing printed circuit board 110 with connector 112 soldered thereto, into bottom support member 104 molded directly to bottom cover 108. Top support member 102, molded directly to top cover 106, is then placed in horizontal abutment against bottom support member 104, enclosing printed circuit board 110 between top and bottom covers 106, 108. Both top and bottom support members 102, 104 are configured such that connector 112 can be seated snugly between support members 102,104 forming one edge of the rectangular package 100. The two support members are then welded together to form a sturdy, sealed electronic package.

Alternate PCMCIA package designs are assembled in a slightly different manner, but the improved mechanism for grounding the metal covers of the present invention can be applied to these alternate designs as well. These alternate designs include PCMCIA packages having a single piece frame where the covers snap fit over the frame after the printed circuit board has been placed within the frame. In another alternative PCMCIA package design, the covers and the frame are assembled first, prior to the installation of the printed circuit board and electrical connector. The frame encloses three sides of the package but leaves the fourth side open so that the printed circuit board can be slidably inserted into the cavity formed between the two covers. When the printed circuit board is fully inserted into the package, the connector engages the frame to the seal the cavity and forms the fourth side of the frame. The present invention can be practiced with any of these designs to provide a secure electrical connection between the ground plane of the printed circuit board and the metal covers to protect against EMI.

Figure 3:
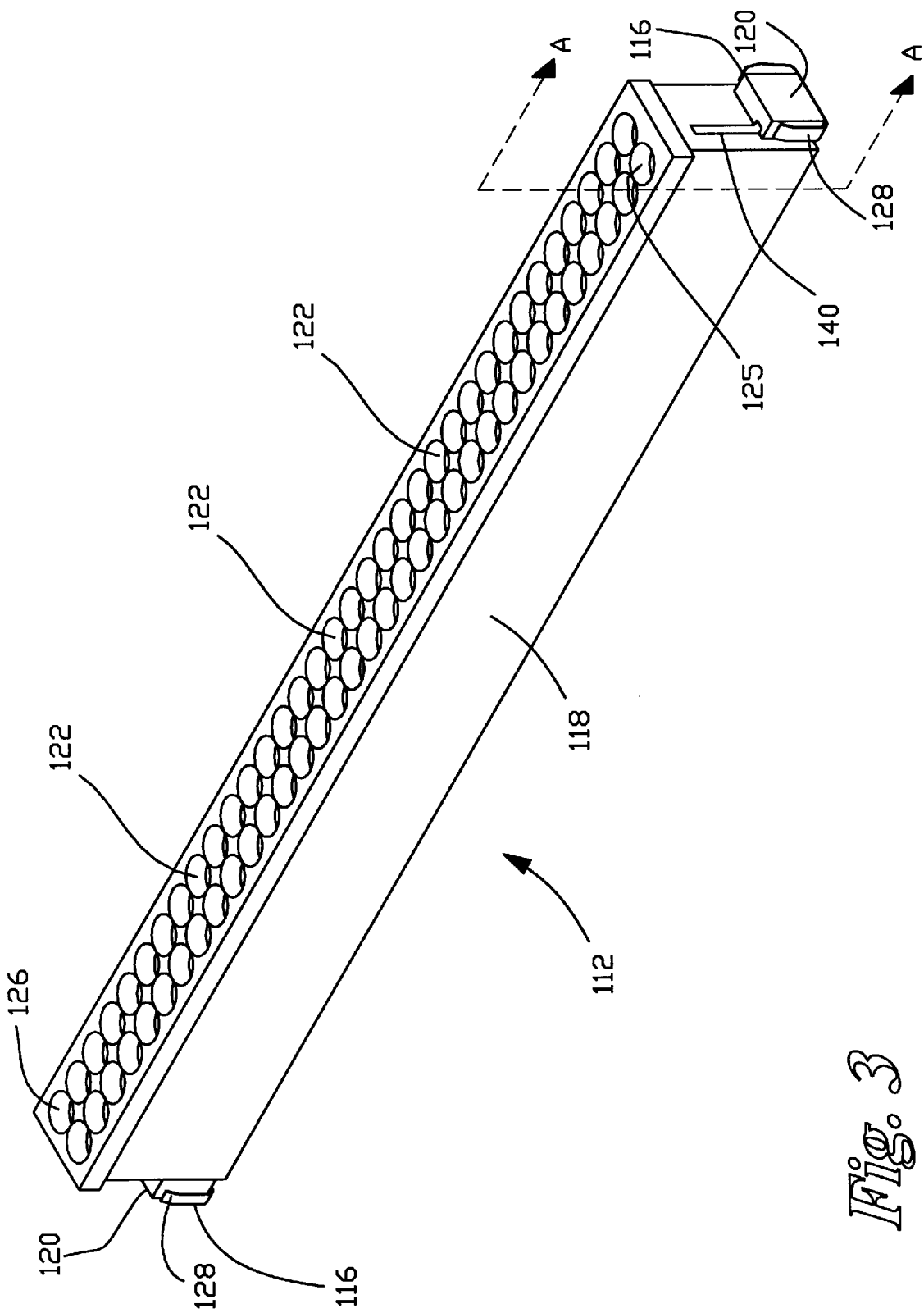
FIG. 3 is an isometric view of the connector of FIG. 1 showing the opposite side of the connector configured to mate with a similar connector on a host device, and having a grounding member inserted into the connector housing.

In the preferred embodiment depicted in FIG. 5, an electrical connection between the metal covers 106, 108 and the ground plane of the printed circuit board 110 is provided by means of a specially adapted connector 112 having grounding members 116 attached to the ends thereof. Connector 112 is shown in isometric view in FIGS. 1 and 3. FIG. 1 shows the back surface if connector 112 which attaches to printed circuit board 110. FIG. 3 shows the opposite side of connector 112 configured to engage a mating connector of a host device. In FIG. 3 grounding members 116 are shown attached, while FIG. 1 shows connector 112 alone.

Connector 112 is formed of a long narrow plastic housing 118 with mounting shoulders 120 formed at each end. Housing 118 defines a plurality of internal contact cavities 122 configured to receive male contact pins from a mating connector of a host device (not shown). Each individual contact cavity 122 contains a conductive contact element 124 which can be soldered to one of the various circuits formed on printed circuit board 110. Thus, when female connector 112 is mated with the male connector of a host device, the pins from the male connector engage contact elements 124 thereby coupling signals between the host device and printed circuit board 110.

The individual contact positions of connector 112 are numbered sequentially from left to right starting with position one in the upper left corner when viewing connector 112 from the front as shown in FIG. 3, position 35 is the lower left comer, position 34 the upper right comer, and position 68 in the lower left comer. According to the PCMCIA standard, the first thirty-fourth, thirty-fifth, and sixty-eighth positions are designated as ground positions. The preferred embodiment of the present invention utilizes first and sixty-eighth positions, shown here as 125 and 126, for grounding the metallic covers. The first and sixty-eight contact pins of the host connector are connected to the host device's signal ground, and are to be connected to the ground plan of printed circuit board 110 upon mating with connector 112 of PCMCIA package 100. On the connector 112 side, the contact elements 124 located within ground positions 125, 126 of the female connector 112 are soldered to contact pads which are electrically connected to the ground plane of printed circuit board 110. Thus, when package 100 is inserted into a host device, and female connector 112 is mated to the male connector of the host device, the ground plane of the printed circuit board 110 will be coupled directly to the reference ground potential of the host device.

It can be seen that ground positions 125, 126 are adjacent to mounting shoulders 120 located at each end of connector housing 118. Mounting shoulders 120 are formed with slots 140 which allow a portion of grounding members 116 to be inserted into connector housing 118. Each slot 140 communicates with the contact cavity of one of the ground positions 125, 126.

Figure 2:
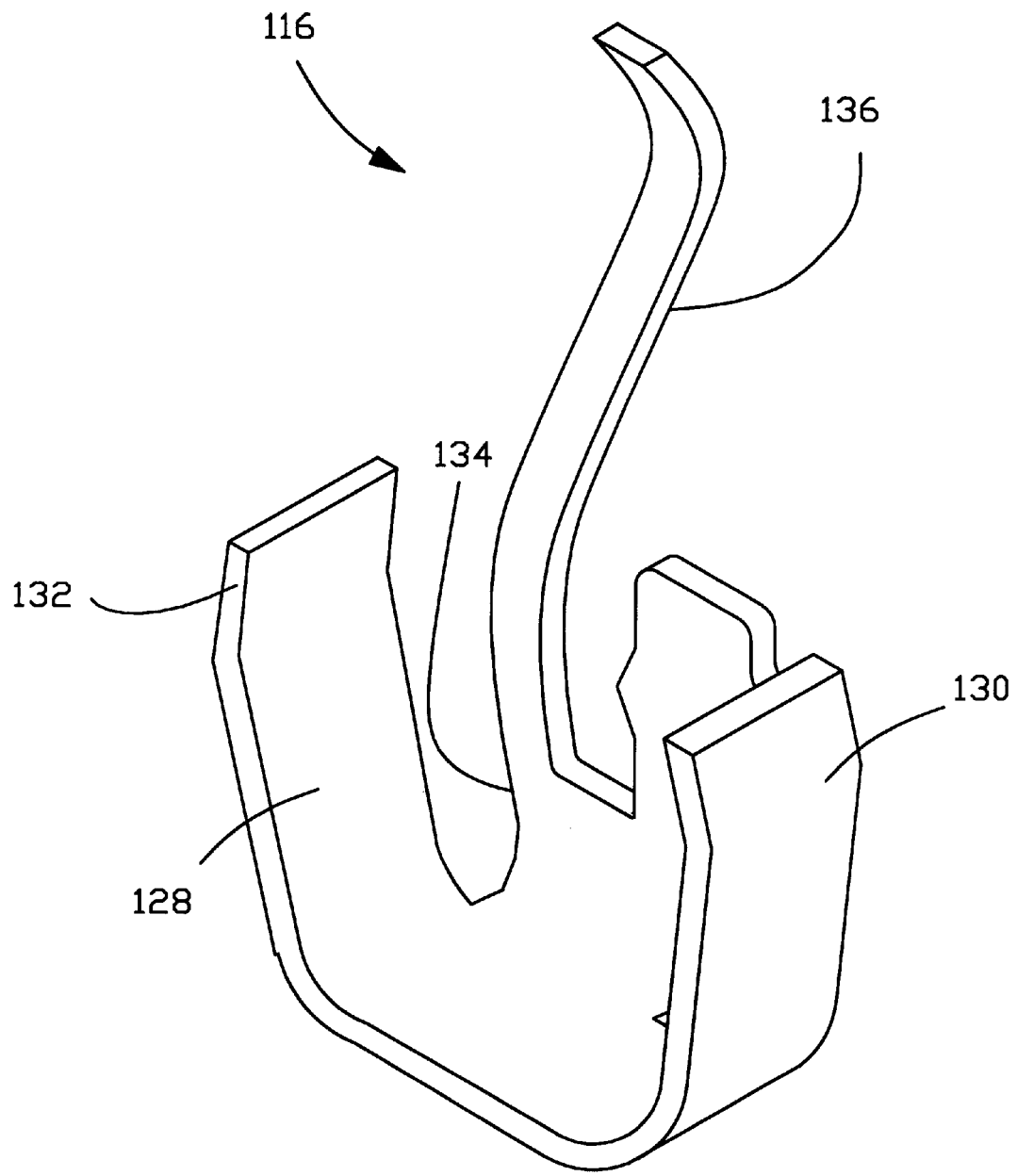
FIG. 2 is an isometric view of a grounding member according to the present invention prior to being inserted into a connector.

Referring now to FIG. 2, an isometric view of a grounding member 116 according to the present invention is shown. Each grounding member 116 is formed from a conductive metal stamping configured into a U-shaped contact spring 128 having a top contact arm 130 and a bottom contact arm 132. An insert tail 134 extends laterally a short distance from the lower segment of the U-shaped contact spring 128, then turns 90° so that an insert contact 136 extends generally in the same direction as top and bottom contact arms 130, 132. The end of insert contact 136 is formed with an angled section such that insert contact 136 extends somewhat further in the lateral direction so that insert contact 136 extends further into an adjacent ground position contact cavity when grounding member 116 is inserted into connector housing 118 where it can physically engage contact element 124 housed therein.

Figure 4:
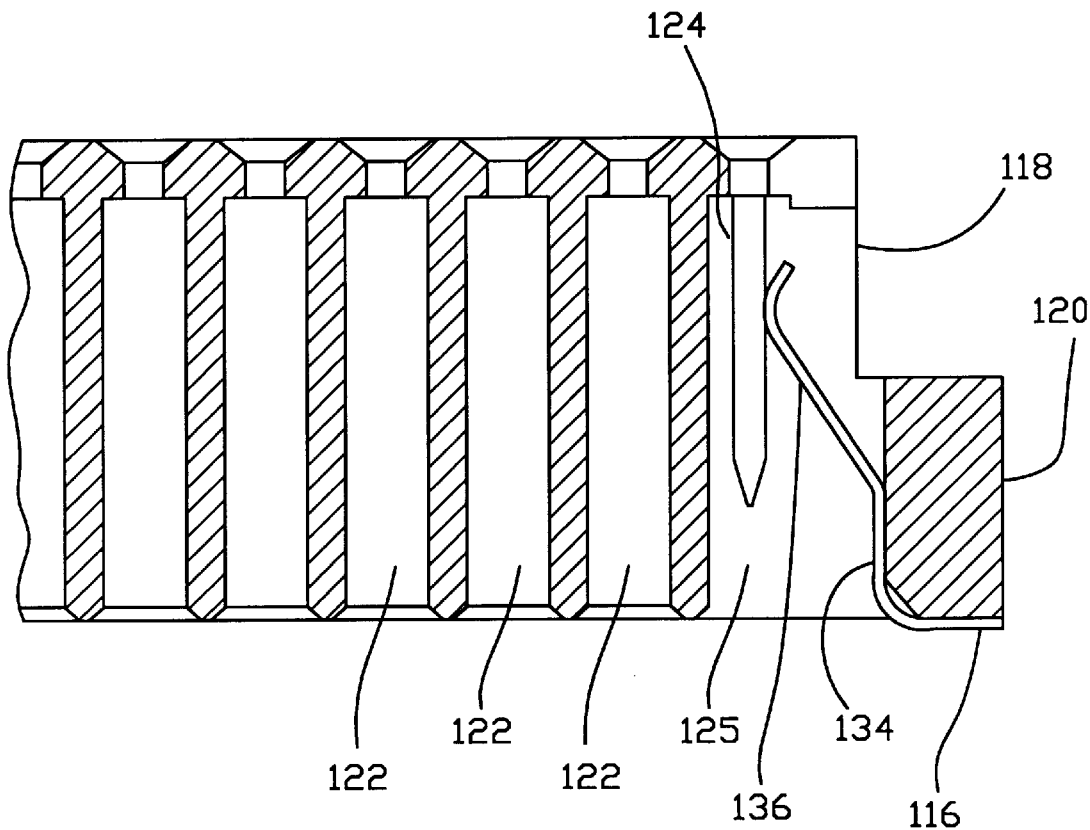
FIG. 4 is a section view of the connector and grounding member of FIG. 3 taken along the line A—A.

FIG. 4 shows a cross sectional view of contact housing 118 with a grounding member 116 inserted therein. As can be seen in the drawing, slot 140 communicates with the contact cavity 122 of ground position 125, allowing insert contact 136 to be inserted into the ground position contact cavity 122. In the figure shown insert contact 136 is configured to physically engage the male contact pin from the mating host connector. Contact insert 136 can be alternately configured to engage contact element 124. Along the bottom of connector housing 118, insert tail 134 runs laterally between contact insert 136 and external U-shaped contact spring 128. Outside connector housing 118, best seen in FIG. 3, the top and bottom contact arms 130, 132 of U-shaped contact spring 128 partially envelop the top and bottom sides of the mounting shoulder 120, extending beyond the width of the connector 112 itself.

In the configuration described above, insert contact 136 forms an electrical connection with the contact element 124 housed within the ground position contact cavity. Since grounding member 116 is formed of a single piece of conductive material, all points on the grounding member 116, including insert contact 136 and top and bottom contact arms 130, 132, will be held to the same potential. With contact insert fly engaging contact element 124, and contact element 124 being connected to the ground plane of printed circuit board 110, top and bottom contact arms 130, 132 will be held to the same electrical potential as the ground plane of printed circuit board 110. When the connector is mated with the male connector of the host device, the ground pins of the host connector engage contact elements 124 within ground positions 125, 126, thereby connecting the signal ground reference of the host device to the ground plane of printed circuit board 110. Thus, both the ground plane of the printed circuit board 110, and grounding members 116 will be held to the signal reference ground potential of the host device.

Mounting shoulders 120 formed on the connector housing 118 act not only to support grounding members 116, but also to align and secure connector 112 within support members 102, 104. Referring again to FIG. 5, it can be seen that bottom support member 104 is formed with mounting notches or grooves 144 for receiving mounting shoulders. Mounting grooves 144 extend through the entire width of bottom support member 104 such that the floor of the grooves is defined by bottom metal cover 108. Although not visible in FIG. 1, top support member 102 is formed with notches or grooves identical to those formed in bottom support member 104. After connector 112 has been soldered to printed circuit board 110 the assembly can be placed in lower support member 104 with mounting shoulders 120 aligned within mounting grooves 144. Since the top and bottom contact arms 130, 132 of the U-shaped contact spring portion 128 are spaced further apart than the transverse width of connector housing 118, the bottom contact arms 132 will contact bottom cover 108 before connector housing 118 is fully seated. Likewise, as top support member 102 is brought down over the assembly, the upper half of mounting shoulders 120 line up with the upper alignment grooves formed in top support member 102, and the top contact arms 130 of the two grounding members 116 will contact the top metal cover 106 before the top support member is fully seated over connector housing 118. To bring the two support members 102, 104 into horizontal abutment, the contact spring portion 128 of the two grounding members 116 must be compressed by forcing the two metal covers 106, 108 together. Elastic forces within the contact springs 128 bias the top and bottom contact arms 130, 132 against the top and bottom covers 106, 108, thereby establishing a firm electrical contact. The connection formed between the contact arms and the metal covers establishes an effective ground path between the metal covers and the ground plane of printed circuit board 110. In this way, the act of assembling the PCMCIA package 100 automatically establishes the ground path between top and bottom covers 130, 132 and the ground plane of printed circuit board 110, without the need for any additional manufacturing steps.

The present invention as described above is readily adapted for use with a PCMCIA package having an alternate frame design as previously discussed. The only requirements are that when the package is fully assembled, there is a clear path between the contact arms 130, 132 of the contact spring portion 128 of the grounding members 116, and that the spacing between the metal covers is less than the distance between the contact arms 130, 132. Meeting these conditions ensures that the contact arms 130, 132 are compressed between the metal covers 106, 108, and that firm electrical contact is maintained.

From the above description it is clear that the present invention provides an electronic circuit module 100 having an improved mechanism for grounding the metal covers 106, 108 thereof. The present invention does so without consuming any real estate on printed circuit board 110, and also provides a connection between the ground plane of the printed circuit board 110 and the reference ground potential of a host device.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. An electronic circuit module comprising:

a frame including a first end having a mounting notch formed therein and the mounting notch adjacent the edge of the circuit module and having a floor defined by a metal cover;

the metal cover attachable to said frame;

a printed circuit board having a ground plane associated therewith disposed between said frame and said cover;

an electrical connector having a plurality of contact elements attached to said printed circuit board at the first end and mounted within the notch; and a ground member protruding from the electrical connector, the ground member including a spring contact extending generally parallel to the floor so that upon mounting of the ground member within the mounting notch the spring contact engages the floor of the notch providing a ground path between said cover and said ground plane.

2. The module of claim 1 wherein at least one of said contact elements is electrically connected to said printed circuit board ground plane.

3. The module of claim 2 wherein said ground path forming means comprises a conductive grounding member configured to physically engage both said metal cover and said at least one contact element electrically connected to said printed circuit board ground plane.

4. The module of claim 3 wherein said electrical connector comprises an insulating housing having a mounting shoulder disposed on a lateral end thereof, said mounting shoulder having mounted thereto at least one contact element electrically connected to said printed circuit board ground plane and the mounting shoulder being received by the mounting notch of the frame.

5. The module of claim 4 wherein the contact element grounds a top and bottom metal cover.

6. The module of claim 4 wherein said grounding member includes a spring contact configured to partially envelop said mounting shoulder, said spring contact including a contact arm disposed between said mounting shoulder and said metal cover such that said mounting shoulders being seated within said notch, said spring contact is compressed between said mounting shoulder and said metal cover, thereby forming an electrical connection between said metal cover and said grounding member.

7. The module of claim 6 wherein said mounting shoulder defines a slotted passage communicating with a cavity in which said at least one contact element is mounted and is electrically connected to said printed circuit board ground plane, and said grounding member includes a contact insert configured to be insertable into said slotted passage wherein said contact insert physically engages said at least one contact element electrically connected to said printed circuit ground plane, thereby forming a direct ground path between said metal cover and said ground plane.

8. An electronic circuit module interconnected with a host device, having at least one metal cover and providing an interface whereby electronic signals are exchanged between said module and a host device, said module providing an improved mechanism for electrically grounding said at least one metal cover, said module comprising:

a module frame for attaching said at least one metal cover thereto;

a printed circuit board having an array of electronic circuits disposed thereon, including a ground plane, said printed circuit board adapted to mount within said frame;

a connector having a plurality of contact elements electrically connected to various said circuits disposed on said printed circuit board, including at least one contact element electrically connected to said ground plane;

a conductive grounding member associated with said connector such that said grounding, member forms an electrical connection with one of said at least one contact elements electrically connected to said ground plane; and said grounding member engages said at least one metal cover, thereby forming a ground path between said cover and said ground plane wherein said connector further comprises a first mounting shoulder formed at a first lateral end of said connector, said connector including a slotted passage communicating between the first lateral end and a cavity in which said at least one contact element is mounted and is electrically connected to said ground plane.

9. The electronic circuit module of claim 8 wherein said grounding member includes a contact insert insertable into said slotted passage wherein said contact insert engages said at least one contact element electrically connected to said ground plane.

10. The electronic circuit module of claim 9 wherein said grounding member includes a spring contact partially enveloping said first mounting shoulder, said spring contact having a contact arm configured to engage said metal cover such that said first mounting shoulder being seated within said frame, said spring contact is compressed between said first mounting shoulder and said metal cover, thereby forming an electrical connection between said metal cover and said grounding member.

11. The electronic circuit module of claim 10 having top and bottom metal covers, said spring contact having a top contact arm and a bottom contact arm, said top contact arm being disposed between said top metal cover and said first mounting shoulder, and said bottom contact arm being disposed between said bottom metal cover and said first mounting shoulder.

12. The electronic circuit module of claim 11 wherein said electronic circuit module further comprises:

a second mounting shoulder formed at a second lateral end of said connector;

a second contact element electrically connected to said ground plane, said first contact element electrically connected to said ground plane being adjacent said first mounting shoulder, and said second contact element electrically connected to said printed circuit board being adjacent said second mounting shoulder, said second mounting shoulder including a slotted passage communicating with said second contact element electrically connected to said ground plane; and a second grounding member including a second contact insert insertable into said second slotted passage wherein said second contact insert engages said second contact element electrically connected to said ground plane.

13. The electronic circuit module of claim 8 wherein said module frame is formed with a mounting notch for receiving said mounting shoulder, said notch having a floor defined by said metal cover.

14. The electronic circuit module of claim 8 wherein said connector comprises a sixty-eight pin connector.

15. A mechanism for connecting a metal cover of an electronic circuit module to a ground plane of a printed circuit board mounted within the electronic circuit module, said mechanism further providing an electrical connection between said ground plane and a signal ground reference potential supplied by a host device, said mechanism comprising:

an electrical connector configured to pluggably engage a mating connector of said host device, said connector including a housing having first and second lateral ends and a vertical transverse width, said housing defining a plurality of contact cavities, each containing a contact element electrically connectable to said printed circuit board, at least one of said contact elements being connected to said ground plane and positioned to receive a signal reference ground contact from said mating connector of said host device;

a top cover and a bottom cover mounted on each side of the connector; and a grounding member formed of conductive material having a first end and a second end enveloping a mounting shoulder of said connector, said mounting shoulder defined by a rectangular insulator protruding therefrom said grounding member being electrically connected said at least one contact element connected to said ground plane, said grounding member being further configured so that the first end physically engages said metal top cover and the second end physically engages said metal bottom cover, thereby establishing a ground path between said metal cover and said ground plane.

16. The mechanism of claim 15 wherein said connector includes a mounting shoulder is formed on said first lateral end thereof adjacent to said at least one contact element connected to said ground plane, said grounding member partially enveloping said mounting shoulder.

17. The mechanism of claim 16 wherein said shoulder defines an internal passage through said housing communicating with the contact cavity housing said at least one contact element electrically connected to said ground plane.

18. The mechanism of claim 17 wherein said grounding member comprises a distended tail insertable into said passage such that said tail physically engages said at least one contact element connected to said ground plane, and opposite said tail a U-shaped contact spring including a pair of contact arms extend substantially parallel to one another configured to partially envelop said mounting shoulder.

19. The mechanism of claim 18 wherein the spacing between said parallel contact arms is greater than the transverse width of said connector housing.

20. The mechanism of claim 19 further comprising:

a second contact element electrically connected to said ground plane;

a second mounting shoulder formed on said second lateral end of said connector housing, adjacent to said second contact element electrically connected to said ground plane;

a second grounding member identical to said first grounding member;

said second mounting shoulder defining an internal passage for receiving said second grounding member.

21. The mechanism of claim 16 wherein the grounding member is located within a mounting notch formed in a frame of the metal cover wherein the notch forms a passageway and exposes the metal cover to which the frame is attached and the metal cover is exposed by the notch.

* * * * *